(12) United States Patent
Zhang et al.

(10) Patent No.: US 10,819,487 B2
(45) Date of Patent: Oct. 27, 2020

(54) PILOT TRANSMISSION METHOD, TERMINAL DEVICE, AND NETWORK DEVICE

(71) Applicant: Huawei Technologies Co., Ltd., Shenzhen, Guangdong (CN)

(72) Inventors: Gongzheng Zhang, Hangzhou (CN); Jian Wang, Hangzhou (CN); Yunfei Qiao, Hangzhou (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 16/291,919

(22) Filed: Mar. 4, 2019

(65) Prior Publication Data

US 2019/0260526 A1 Aug. 22, 2019

Related U.S. Application Data

(63) Continuation of application No. PCT/CN2017/098329, filed on Aug. 21, 2017.

(30) Foreign Application Priority Data

Sep. 5, 2016 (CN) .......................... 2016 1 0802887

(51) Int. Cl.
*H04L 5/00* (2006.01)
*H04W 76/27* (2018.01)
(Continued)

(52) U.S. Cl.
CPC ............ *H04L 5/005* (2013.01); *H04L 5/0051* (2013.01); *H04L 5/0082* (2013.01);
(Continued)

(58) Field of Classification Search
None
See application file for complete search history.

(56) References Cited

U.S. PATENT DOCUMENTS

| 8,964,886 B2 | 2/2015 | Jung et al. |
| 9,755,881 B1 * | 9/2017 | Moshavi ............. H04L 27/2672 |

(Continued)

FOREIGN PATENT DOCUMENTS

| CN | 101132384 A | 2/2008 |
| CN | 101137224 A | 3/2008 |

(Continued)

OTHER PUBLICATIONS

"3rd Generation Partnership Project; Technical Specification Group Radio Access Network; Evolved Universal Terrestrial Radio Access (E-UTRA); Physical channels and modulation(Release 13)", 3GPP TS 36.211 V13.2.0 (Jun. 2016), 168 pages.

(Continued)

*Primary Examiner* — Diane L Lo
(74) *Attorney, Agent, or Firm* — Slater Matsil, LLP

(57) ABSTRACT

This application provides a pilot transmission method, including: determining, by a first terminal device, a target first pilot and a target second pilot group corresponding to the target first pilot, where the target first pilot is used by a network device to perform terminal device detection, and the target second pilot group includes at least two second pilots; and sending, by the first terminal device, the target first pilot and the target second pilot group to the network device in a time unit, where each second pilot in the target second pilot group is repeatedly sent on at least two symbols of the time unit, and the target second pilot group is used by the network device to perform frequency offset estimation.

20 Claims, 6 Drawing Sheets

(51) Int. Cl.
*H04L 25/02* (2006.01)
*H04L 27/26* (2006.01)
*H04W 8/00* (2009.01)
*H04L 27/00* (2006.01)
*H03M 13/13* (2006.01)
*H04J 13/00* (2011.01)

(52) U.S. Cl.
CPC ...... *H04L 25/0224* (2013.01); *H04L 25/0226* (2013.01); *H04L 27/0014* (2013.01); *H04L 27/2613* (2013.01); *H04L 27/2657* (2013.01); *H04L 27/2666* (2013.01); *H04L 27/2675* (2013.01); *H04W 8/005* (2013.01); *H04W 76/27* (2018.02); *H03M 13/136* (2013.01); *H04J 13/0062* (2013.01); *H04L 5/0007* (2013.01); *H04L 5/0016* (2013.01); *H04L 5/0037* (2013.01); *H04L 5/0091* (2013.01); *H04L 27/2688* (2013.01); *H04L 27/2692* (2013.01)

(56) References Cited

U.S. PATENT DOCUMENTS

| | | | | |
|---|---|---|---|---|
| 2007/0098100 | A1* | 5/2007 | Charbit | H04L 27/2655 |
| | | | | 375/260 |
| 2007/0230388 | A1* | 10/2007 | Li | H04B 1/707 |
| | | | | 370/313 |
| 2012/0163497 | A1 | 6/2012 | Kim et al. | |
| 2012/0207253 | A1 | 8/2012 | Park et al. | |
| 2013/0215801 | A1 | 8/2013 | Mai et al. | |
| 2014/0056262 | A1* | 2/2014 | Shimomura | H04L 23/02 |
| | | | | 370/329 |
| 2014/0146859 | A1* | 5/2014 | Ram | H04L 1/20 |
| | | | | 375/211 |
| 2016/0056937 | A1* | 2/2016 | Yun | H04L 5/0016 |
| | | | | 370/329 |
| 2017/0310525 | A1* | 10/2017 | Lin | H04L 27/2698 |

FOREIGN PATENT DOCUMENTS

| | | |
|---|---|---|
| CN | 101277288 A | 10/2008 |
| CN | 101379790 A | 3/2009 |
| CN | 103262430 A | 8/2013 |
| CN | 103686689 A | 3/2014 |
| WO | 2016134763 A1 | 9/2016 |

OTHER PUBLICATIONS

"3rd Generation Partnership Project; Technical Specification Group Radio Access Network; Evolved Universal Terrestrial Radio Access (E-UTRA); Radio Resource Control (RRC); Protocol specification (Release 13)", 3GPP TS 36.331 V13.2.0 (Jun. 2016), 623 pages.

Chong, M.A., "The Research and Implementation of Channel Estimation Algorithm in TD-LTE Uplink," Beijing University of Posts and Telecommunications, Mar. 12, 2015, 80 pages.

Intel Corporation, "Further discussion on GI-DFT-s-OFDM for high frequency bands above 40 GHz," 3GPP TSG RAN WG1 Meeting #86, R1-167126, Gothenburg, Sweden, Aug. 22-26, 2016, 9 pages.

Intel Corporation, "Grant-less and non-orthogonal UL transmissions in NR", 3GPP TSG-RAN WG1 #86, R1-167698, Gothenburg, Sweden, Aug. 22-26, 2016, 5 pages.

Mitsubishi Electric, "Reducing UL RS overhead for sPUSCH," 3GPP TSG RAN WG1 Meeting #85 , R1-164115, Nanjing, May 23-27, 2016, 16 pages.

* cited by examiner

PILOT TRANSMISSION METHOD, TERMINAL DEVICE, AND NETWORK DEVICE

CROSS-REFERENCE TO RELATED APPLICATIONS

This application is a continuation of International Application No. PCT/CN2017/098329, filed on Aug. 21, 2017, which claims priority to Chinese Patent Application No. 201610802887.5, filed on Sep. 5, 2016. The disclosures of the aforementioned applications are hereby are incorporated by reference in their entireties.

TECHNICAL FIELD

This application relates to the communications field, and more specifically, to a pilot transmission method, a terminal device, and a network device.

BACKGROUND

Internet of Things (IoT) services are one of main services supporting a future cellular mobile communications system. Different from mobile broadband (MBB) services, main service scenarios of the IoT services are massive machine communications (MMC) and mission critical communications (MCC). MMC and MCC mainly feature a large quantity of potential connected users, a small data packet, a low access delay, high transmission reliability, and the like.

To adapt to application scenarios of MMC and MCC, a one-time transmission mode is usually used for the IoT services. That is, data transmission is completed in one transmission opportunity to avoid an access delay brought by scheduling. In the one-time transmission mode, main functions of a pilot are user detection, channel estimation, frequency offset estimation, time offset estimation, and the like. In the transmission mode, a terminal device having data to be transmitted selects a pilot, and sends the data and the pilot together. A base station detects the pilot to determine a status of the terminal device; and if detecting that the terminal device is in an active state, performs channel estimation, frequency offset estimation, time offset estimation, and the like by using the pilot, and decodes data based on an estimation result.

In the prior art, one slot has two symbols for carrying a pilot. The pilot in the slot is not only used by the base station to perform user detection but also used by the base station to perform frequency offset estimation. In this case, a frequency offset estimation result is inaccurate, leading to relatively poor transmission performance of an IoT service.

SUMMARY

This application provides a pilot transmission method, which can support accurate frequency offset estimation, thereby improving system performance.

According to a first aspect, a pilot transmission method is provided. The method includes: determining, by a first terminal device, a target first pilot and a target second pilot group corresponding to the target first pilot, where the target first pilot is used by a network device to perform terminal device detection, and the target second pilot group includes at least two second pilots; and sending, by the first terminal device, the target first pilot and the target second pilot group to the network device in a time unit, where each second pilot in the target second pilot group is repeatedly sent on at least two symbols of the time unit, and the target second pilot group is used by the network device to perform frequency offset estimation.

The terminal device detection may also be referred to as user detection. The time unit may be a slot, a subframe, a frame, or a transmission time interval (TTI), or even may be a length of several symbols. This is not limited in embodiments of this application.

According to the pilot transmission method provided in the first aspect, two pilots are distinguished. A first pilot is used for terminal device detection, a second pilot group corresponding to the first pilot is used for frequency offset estimation, and each second pilot in the second pilot group is repeated on at least two symbols of a time unit. This can support accurate frequency offset estimation, thereby improving system performance.

In a possible implementation of the first aspect, before the determining, by a first terminal device, a target first pilot and a target second pilot group corresponding to the target first pilot, the method further includes: receiving, by the first terminal device, Radio Resource Control RRC signaling sent by the network device, where the RRC signaling includes information used to indicate a correspondence between a first pilot and a second pilot group. The determining, by a first terminal device, a target first pilot and a target second pilot group corresponding to the target first pilot includes: determining, by the first terminal device, the target first pilot; and determining, by the first terminal device based on the correspondence, the target second pilot group corresponding to the target first pilot. In the possible implementation, the network device notifies the terminal device of the correspondence between a first pilot and a second pilot group by using the RRC signaling, so that both a receiver and a sender can quickly receive and send two pilots.

According to a second aspect, a pilot transmission method is provided. The method includes: receiving, by a network device, a target first pilot sent by a first terminal device in a time unit and a target second pilot group that corresponds to the target first pilot and that is repeatedly sent by the first terminal device on at least two symbols of the time unit, where the target second pilot group includes at least two second pilots; performing, by the network device, terminal device detection based on the target first pilot; and performing, by the network device, frequency offset estimation based on a second pilot in the target second pilot group that is repeatedly sent on the at least two symbols of the time unit.

In a possible implementation of the second aspect, the receiving, by a network device, a target first pilot sent by a first terminal device in a time unit and a target second pilot group that corresponds to the target first pilot and that is repeatedly sent by the first terminal device on at least two symbols of the time unit includes: receiving, by the network device, at least one first pilot and at least one second pilot group in the time unit, where each of the at least one second pilot group includes at least two second pilots, the at least one first pilot includes the target first pilot, and the at least one second pilot group includes the target second pilot group. The performing, by the network device, terminal device detection based on the target first pilot includes: performing, by the network device, terminal device detection based on the target first pilot, to determine that a terminal device corresponding to the target first pilot is the first terminal device. The method further includes: determining, by the network device based on a correspondence between a first pilot and a second pilot group, the target second pilot group corresponding to the target first pilot in the at least one second pilot group.

In a possible implementation of the second aspect, the method further includes: sending, by the network device, Radio Resource Control RRC signaling to the first terminal device, where the RRC signaling includes information used to indicate the correspondence between the first pilot and the second pilot group.

In a possible implementation of the second aspect, the performing, by the network device, frequency offset estimation based on a second pilot in the target second pilot group that is repeatedly sent on the at least two symbols of the time unit includes: performing, by the network device, frequency offset estimation based on a phase difference of at least one second pilot, which does not conflict with another terminal device in the target second pilot group, repeatedly sent on the at least two symbols of the time unit.

According to a third aspect, a pilot transmission method is provided. The method includes: determining, by a first terminal device, a target first pilot and a target second pilot group corresponding to the target first pilot, where the target second pilot group includes at least two second pilots, and the target first pilot is used by a network device to perform terminal device detection; and sending, by the first terminal device, the target first pilot and the target second pilot group to the network device in a time unit, where the target first pilot and the target second pilot group are used by the network device to perform frequency offset estimation.

According to a fourth aspect, a pilot transmission method is provided. The method includes: receiving, by a network device, at least one first pilot and at least one second pilot group in a time unit, where each of the at least one second pilot group includes at least two second pilots, the at least one first pilot includes a target first pilot, and the at least one second pilot group includes a target second pilot group; performing, by the network device, terminal device detection based on the target first pilot, to determine that a terminal device corresponding to the target first pilot is the first terminal device; determining, by the network device based on a correspondence between a first pilot and a second pilot group, the target second pilot group corresponding to the target first pilot in the at least one second pilot group; and performing, by the network device, frequency offset estimation based on a phase difference between the target first pilot and at least one second pilot in the target second pilot group.

In a possible implementation of the second aspect or the fourth aspect, the method may further include: performing, by the network device, time offset estimation and channel estimation based on at least one second pilot in no conflict with another terminal device in the target second pilot group.

According to a fifth aspect, a terminal device is provided. The terminal device includes a processor and a transceiver, configured to implement corresponding functions of the terminal device in the foregoing aspects. The functions may be implemented by using hardware, or may be implemented by hardware executing corresponding software. The hardware or software includes one or more modules corresponding to the foregoing functions. The terminal device may further include a memory.

According to a sixth aspect, a network device is provided. The network device includes a processor and a transceiver, configured to implement corresponding functions of the network device in the foregoing aspects. The network device may further include a memory.

According to a seventh aspect, a terminal device is provided. The terminal device includes a processing module and a transceiver module, configured to implement corresponding functions of the terminal device in the foregoing aspects. The functions may be implemented by using hardware, or may be implemented by hardware executing corresponding software. The hardware or software includes one or more modules corresponding to the foregoing functions.

According to an eighth aspect, a network device is provided. The network device includes a processing module and a transceiver module, configured to implement corresponding functions of the network device in the foregoing aspects.

It should be understood that, in a possible implementation of the foregoing aspects, any two second pilots in the target second pilot group are orthogonal in code domain, or occupy orthogonal time frequency resources.

In a possible implementation of the foregoing aspects, second pilots of different terminal devices that occupy a same time frequency resource are orthogonal in code domain, or time frequency resources occupied by second pilots of different terminal devices are orthogonal.

In a possible implementation of the foregoing aspects, the target first pilot is a pilot in a first pilot set, the first pilot set includes a universal set of pilots used to perform terminal device detection and used by a terminal device served by the network device, each second pilot in the target second pilot group is a pilot in a second pilot set, the second pilot set includes a universal set of pilots used to perform frequency offset estimation and used by the terminal device served by the network device, the first pilot set includes two first pilots having a degree of coherence greater than zero, and a degree of coherence between any two second pilots in the second pilot set is zero. In the possible implementation, to resolve a problem that because a pilot set is small and when different terminal devices select a same pilot, in other words, when pilots conflict, a base station detects the terminal devices as a same user, decoding cannot be correctly performed, a first pilot space for user detection may be non-orthogonal. That the first pilot space is non-orthogonal means that two first pilots having a degree of coherence greater than zero exist in the first pilot space.

Optionally, a total quantity of pilots in the first pilot set is less than or equal to a total quantity of second pilot groups formed by pilots in the second pilot set.

In a possible implementation of the foregoing aspects, the target first pilot is a Reed-Muller sequence or a Zadoff-Chu sequence, and each second pilot in the target second pilot group is a Reed-Muller sequence or a Zadoff-Chu sequence.

In a possible implementation of the foregoing aspects, the target first pilot is generated by the first terminal device based on a formula $\phi_{P,b}(x)=A \cdot i^{(2b+Px)^T x}$, where x=bin(k), a value of k is 0, 1, . . . , $2^m-1$, bin(k) is a binary vector representation of k, A is an amplitude normalization parameter, P is a generator matrix, b is a generator vector, and a relationship between m and a length N of the target first pilot satisfies $N=2^m$. Compared with using a ZC sequence, in the possible implementation, a problem that user detection of a pilot has high complexity and low reliability can be resolved by using an RM sequence, thereby reducing detection complexity and improving detection reliability.

DETAILED DESCRIPTION

Figure 1:
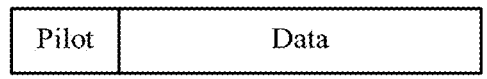
FIG. 1 is a schematic diagram of pilot transmission in a one-time transmission mode.

The following describes technical solutions of this application with reference to accompanying drawings.

Terminologies such as "component", "module", and "system" used in this specification are used to indicate computer-related entities, hardware, firmware, combinations of hardware and software, software, or software being executed. For example, a component may be, but is not limited to, a process that runs on a processor, a processor, an object, an executable file, an executable thread, a program, and/or a computer. As shown in figures, both a computing device and an application that runs on a computing device may be components. One or more components may reside within a process and/or an executable thread, and a component may be located on one computer and/or distributed between two or more computers. In addition, these components may be executed from various computer-readable media that store various data structures. For example, the components may communicate by using a local and/or remote process and according to, for example, a signal having one or more data packets (for example, data from two components interacting with another component in a local system, a distributed system, and/or across a network such as the Internet interacting with other systems by using the signal).

It should be understood that, the technical solutions in the embodiments of this application may be applied to a Long Term Evolution (LTE) architecture, and may be further applied to a universal mobile telecommunications system (UMTS) terrestrial radio access network (UTRAN) architecture, or a Global System for Mobile Communications (GSM)/enhanced data rate for GSM evolution (EDGE) system radio access network (GERAN) architecture. In the UTRAN architecture or the GERAN architecture, a function of an MME is completed by a serving general packet radio service (GPRS) support node (SGSN), and a function of an SGW/PGW is completed by a gateway GPRS support node (GGSN). The technical solutions in the embodiments of this application may be further applied to other communications systems, for example, a public land mobile network (PLMN) system, or even a future 5G communications system or a communications system later than 5G. This is not limited in the embodiments of this application.

A terminal device is used in the embodiments of this application. The terminal device may be referred to as user equipment (UE), an access terminal, a subscriber unit, a subscriber station, a mobile station, a mobile console, a remote station, a remote terminal, a mobile device, a user terminal, a terminal, a wireless communications device, a user agent, or a user apparatus. The access terminal may be a cellular phone, a cordless phone, a Session Initiation Protocol (SIP) phone, a wireless local loop (WLL) station, a personal digital assistant (PDA), a handheld device having a wireless communication function, a computing device, another processing device connected to a wireless modem, an in-vehicle device, a wearable device, or a terminal device in a future 5G network or a network later than 5G. This is not limited in the embodiments of this application.

The terminal device may communicate with one or more core networks by using a radio access network (RAN), or may access a distributed point-to-point (Ad-Hoc) mode network in a self-organizing or license-free manner and a subnet deployed by a user. The terminal device may further access a network in another manner for communication. This is not limited in the embodiments of this application.

A network device is further used in the embodiments of this application. The network device may be a device configured to communicate with the terminal device. For example, the network device may be a base transceiver station (BTS) in a GSM system or a CDMA system, may be a NodeB (NB) in a WCDMA system, or may be an evolved NodeB (eNB or eNodeB) in an LTE system. Alternatively, the network device may be a relay station, an access point, an in-vehicle device, a wearable device, a network side device in a future 5G network or a network later than 5G, a network device in a future evolved PLMN network, or the like.

The network device in the embodiments of this application may be a network device in a cell, and may be a base station on a cell layer or a network device having a function similar to that of a base station. The network device may be a network device providing wireless access and communications services for a mobile or fixed terminal device in a cell.

In addition, aspects or features of this application may be implemented as a method, an apparatus or a product that uses standard programming and/or engineering technologies. The term "product" used in this application covers a computer program that can be accessed from any computer-readable component, carrier or medium. For example, the computer-readable medium may include but is not limited to: a magnetic storage component (for example, a hard disk, a floppy disk or a magnetic tape), an optical disc (for example, a compact disc (CD), a digital versatile disc (DVD), a smart card and a flash memory component (for example, an erasable programmable read-only memory (EPROM), a card, a stick, or a key drive). In addition, various storage media described in this specification may indicate one or more devices and/or other machine-readable media that are configured to store information. The term "machine-readable media" may include but is not limited to a radio channel, and various other media that can store, contain and/or carry an instruction and/or data.

A one-time transmission mode is also referred to as a scheduling-free transmission mode or a contention-free transmission mode. In the one-time transmission mode, as shown in FIG. 1, a terminal device having data to be transmitted selects a pilot, and sends the data and the pilot together. For a data part, a plurality of users may perform superposition transmission by using a sparse code multiple access (SCMA) technology on a same time frequency resource, to increase a quantity of access users supported by a system.

One-time transmission reliability is limited by the following several factors:

Size of a pilot space. Because each terminal device independently selects a pilot for user detection, and when different terminal devices select a same pilot, in other words, when a pilot conflict occurs, the base station detects the terminal devices as a same user, decoding cannot be correctly performed. To reduce a probability of a pilot conflict, the pilot space needs to be far larger than a pilot space provided by an existing system, for example, LTE system. It should be understood that, the pilot space in this specification may also be referred to as a pilot set.

Detection. On one hand, a system using the one-time transmission mode that lacks strict synchronization requires high detection reliability, and during detection, a time offset and a frequency offset between users needs to be resisted, to reduce a probability of false detection and missed detection. On the other hand, the base station needs to determine whether each pilot is used by a user. Therefore, detection complexity needs to be low.

Accuracy of channel estimation, time offset estimation, and frequency offset estimation. Accurate time offset estimation, frequency offset estimation, and channel estimation are key factors of correctly decoding data, especially when a plurality of users simultaneously perform transmission.

Figure 2:
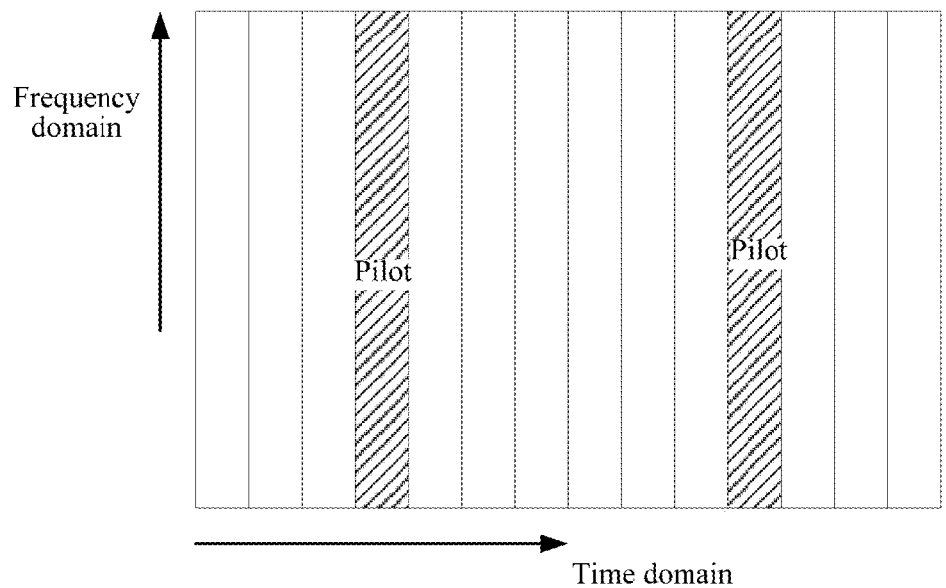
FIG. 2 is a schematic diagram of a configuration of an uplink pilot in an LTE system.

A configuration of an uplink pilot in the existing LTE system is shown in FIG. 2. Two symbols in one slot are used to carry a pilot, and one slot supports a maximum of 12 orthogonal pilots. The uplink pilot configuration method is not applicable to an IoT service. To increase a quantity of pilots in an IoT scenario, symbols used to transmit a pilot in a slot can be added. However, in this method, not only a quantity of added plots is limited, but also detection reliability is reduced and complexity is increased with the quantity of pilots. Therefore, the method cannot be applied to the low-delay high-reliability IoT scenario. In the existing solution, a cyclic shift of a Zadoff-Chu (ZC) sequence is used to distinguish a pilot. The method of simply adding a symbol for sending the ZC sequence cannot satisfy a requirement for a quantity of pilots in the IoT scenario. In addition, as the quantity of pilots increases, detection reliability is reduced, and complexity is increased. Moreover, because the pilot is used for not only user detection but also frequency offset estimation, accuracy of the frequency offset estimation is poor. This causes relatively poor transmission performance of an IoT service.

To resolve the foregoing problem, the embodiments of this application provide a pilot transmission method. The method includes: determining, by a first terminal device, a target first pilot and a target second pilot group corresponding to the target first pilot, where the target first pilot is used by a network device to perform terminal device detection, and the target second pilot group includes at least two second pilots; and sending, by the first terminal device, the target first pilot and the target second pilot group to the network device in a time unit, where each second pilot in the target second pilot group is repeatedly sent on at least two symbols of the time unit, and the target second pilot group is used by the network device to perform frequency offset estimation.

Correspondingly, a network device receives a target first pilot sent by a first terminal device in a time unit and a target second pilot group that corresponds to the target first pilot and that is repeatedly sent by the first terminal device on at least two symbols of the time unit, where the target second pilot group includes at least two second pilots; the network device performs terminal device detection based on the target first pilot; and the network device performs frequency offset estimation based on a second pilot in the target second pilot group that is repeatedly sent on the at least two symbols of the time unit.

Therefore, according to the pilot transmission method provided in the embodiments of this application, two pilots are distinguished. A first pilot is used for user detection, a second pilot group corresponding to the first pilot is used for frequency offset estimation, and each second pilot in the second pilot group is repeatedly sent on at least two symbols of a time unit. This can support accurate frequency offset estimation, thereby improving system performance.

It should be understood that, the pilot in the embodiments of this application is a three-dimensional concept. The pilot includes a sequence, and a time domain resource and a frequency domain resource that are occupied by the sequence. The terminal device detection in the embodiments of this application may also be referred to as user detection. The time unit in the embodiments of this application may be a slot, a subframe, a frame, or a transmission time interval (TTI), or even a length of several symbols. This is not limited in the embodiments of this application.

The target first pilot is a pilot in a first pilot set, the first pilot set includes a universal set of pilots used to perform terminal device detection and used by a terminal device served by the network device, each second pilot in the target second pilot group is a pilot in a second pilot set, and the second pilot set includes a universal set of pilots used to perform frequency offset estimation and used by the terminal device served by the network device. It should be understood that, usually, the pilot used to perform frequency offset estimation is also used to perform time offset estimation and channel estimation.

To resolve the problem mentioned above that because a pilot space is small and when different terminal devices select a same pilot, in other words, when pilots conflict, a base station detects the terminal devices as a same user, decoding cannot be correctly performed, a first pilot set used to perform terminal device detection may be non-orthogonal. That the first pilot set is non-orthogonal means that two first pilots having a degree of coherence greater than zero exist in the first pilot set.

Specifically, a length of a pilot affects a size of a time frequency resource used to perform uplink data transmission in a system. Therefore, the embodiments of this application may be used when the length of the pilot in the existing solution remains unchanged. That is, compared with the solution in the prior art, no additional time frequency resource needs to be allocated, and a quasi-orthogonal code, for example, a quasi-orthogonal Reed-Muller (RM) sequence or a quasi-orthogonal Zadoff-Chu (ZC) sequence, is used as a pilot. For a same pilot length, compared with an orthogonal pilot set, a non-orthogonal first pilot set may include a larger quantity of pilots.

However, the non-orthogonal first pilot set cannot be used to perform channel estimation, time offset estimation, and frequency offset estimation. This is because when using two non-orthogonal pilots, that is, two pilots having a degree of coherence greater than zero, different terminal devices cannot accurately perform channel estimation, time offset estimation, and frequency offset estimation. Therefore, an orthogonal second pilot set is used in the embodiments of this application to perform channel estimation, time offset estimation, frequency offset estimation, and the like.

Orthogonality means that a degree of coherence between any two second pilots in the second pilot set is zero.

The target second pilot group includes at least two second pilots in the second pilot set. Any two second pilots in the target second pilot group are orthogonal in code domain, or occupy orthogonal time frequency resources. That is, any two second pilots in the target second pilot group may be different sequences, or may be a same sequence but occupy different time frequency resources when being sent.

It should be understood that, a quantity of pilots in each of the first pilot set and the second pilot set should be configured to match a quantity of terminal devices. In addition, a total quantity of pilots in the first pilot set should match a total quantity of second pilot groups formed by pilots in the second pilot set. Preferably, the total quantity of pilots in the first pilot set is less than or equal to the total quantity of second pilot groups formed by the pilots in the second pilot set.

It should be understood that, the target first pilot in the embodiments of this application may be an RM sequence or a ZC sequence. Each second pilot in the target second pilot group may be an RM sequence or a ZC sequence. Both the target first pilot and each second pilot in the target second pilot group may be RM sequences, or may be ZC sequences. Alternatively, the target first pilot may be an RM sequence, and each second pilot in the target second pilot group may be a ZC sequence. Alternatively, the target first pilot may be a ZC sequence, and each second pilot in the target second pilot group may be an RM sequence.

A method for generating a sequence corresponding to a pilot in a pilot space (a first pilot space or a second pilot space) formed by ZC sequences is as follows, where a length of the pilot is N.

Step 1: Generate an available radical exponent (roots) set $\{r_1, \ldots, r_N\}$, where the radical exponent set is any r from 1 to N (corresponding to an orthogonal pilot space having a size of N); or the radical exponent set includes all r from 1 to N (corresponding to a non-orthogonal pilot space having a size of $N^2$, where the foregoing orthogonal pilot space is included).

Step 2: Select one value from 0 to N−1 as a cyclic shift value.

Step 3: For all optional radical exponent sets and all cyclic shift values, first, generate a ZC base sequence having a length of N based on the following formula, and then perform corresponding cyclic shifting to obtain a user sequence:

$$x_r(n) = \exp\left(-j\frac{\pi rn(n+1)}{N}\right)$$

where ceil ( ) represents rounding up. For the ZC sequence, a requirement for the degree of coherence can be met by setting the length N of the pilot to a prime number. For the ZC sequence, the non-orthogonal pilot space can be obtained only in the foregoing manner, a quantity of pilots that can be extended is limited, and extensibility is inferior to that of the RM sequence.

Pilot detection performance based on cyclic shifting of the ZC sequence is sensitive to a time offset. A larger time offset leads to a higher false detection probability. A correlation operation is used for user status detection. That is, a correlation operation needs to be performed on all candidate pilots and an access channel. In this case, complexity is high.

A method for generating a sequence corresponding to a pilot in a pilot space (a first pilot space or a second pilot space) formed by RM sequences is as follows, where a length of the pilot is N.

Step 1: Generate a set $\{P_1, \ldots, P_M\}$ of m×m binary P matrices, where $M=2^{m(r-1)}$, where the set of P matrices is any P matrix in a Kerdock set (corresponding to an orthogonal pilot space having a size of N), where M=1 and r=1; or the set of P matrices includes all $N=2^m$ P matrices in a Kerdock set (corresponding to a non-orthogonal pilot space having a size of $N^2$, where the foregoing orthogonal pilot space is included), where $M=2^m$ and r=2; or

. . . .

the set of P matrices is a set of $M=2^{m(r-1)}$ P matrices, that is, a Delsarte-Goethals (m,r) set, where $M=2^m$, and r is greater than 2.

Step 2: Generate a set $\{b_1, \ldots, b_N\}$ of binary vectors b having a length of m.

Step 3: For all (P, b) pairs, generate an RM sequence having a length of $N=2^m$ based on the following formula:

$$\phi_{P,b}(x) = \frac{(-1)^{weight(b)}}{\sqrt{2^m}} i^{(2b+Px)^T x}, \; x = bin(k)$$

where the item $$\frac{(-1)^{weight(b)}}{\sqrt{2^m}}$$

is an optional item, and is functioned as an amplitude normalization parameter A. In practice, a formula $\phi_{P,b}(x) = A \cdot i^{(2b+Px)^T x}$ may be used, where x=bin(k), a value of k is 0, 1, . . . , $2^m-1$, bin(k) is a binary vector representation of k, an amplitude normalization parameter A of $\phi_{P,b}(x) = A \cdot i^{(2b+Px)^T x}$ may be controlled and determined by using upper layer power, P may be referred to as a generator matrix, b may be referred to as a generator vector, and a relationship between m and a length N of the target first pilot satisfies $N=2^m$.

Step 4: A total of $2^{mr}$ RM sequences having a length of N may be generated by using the foregoing method, and the system may select, based on a quantity of current access users, a corresponding quantity of sequences from the $2^{mr}$ RM sequences to form the first pilot set or the second pilot set.

A rule of generating the RM sequence is as follows:

A P matrix required for generating a pilot space corresponding to the RM sequence may be selected from the following nested space:

$$DG(m,0) \subset DG(m,1) \subset \ldots \subset DG(m,r)$$

where DG is short for a Delsarte-Goethals set, and DG(m, 0) is also referred to as the Kerdock set.

The Kerdock set includes a total of $2^m$ P matrices, and is generated by using the following step:

$$Tr[xya] = (x_0 \ldots x_{m-1})P^0(a)(y_0 \ldots y_{m-1})^T$$

where $Tr[x] = x + x^2 + \ldots x^{2^{m-1}}$ is mapping of an element x in $F_{2^m}$ into a binary field $F_2$. All calculation is in a finite field.

Therefore, an element in row i and column j in the P matrix may be obtained by using the following steps.

1. An $i^{th}$ bit of a vector $x_0 \ldots x_{m-1}$ is let be 1 and other bits be 0, and a $j^{th}$ bit of a vector $y_0 \ldots y_{m-1}$ is let be 1 and other bits be 0.

2. The two vectors having a length of m in the binary field $F_2$ are mapped to elements x and y in $F_{2^m}$, and Tr[xya] is calculated.

3. An element in row i and column j in an $a^{th}$ P matrix in the Kerdock set is Tr[xya]. A total of $2^m$ elements a in $F_{2^m}$ correspond to the $2^m$ P matrices in a one to one manner.

DG(m,r) includes a total of $2^{m(r+1)}$ P matrices, and is generated by using the following method:

$$DG(m, r) = \left\{ \sum_{t=0}^{r} P^t(a_t) \mid a_t \in F_{2^m}, t = 0, 1, \cdots, r \right\}$$

There are a total of r+1 elements $a_0, a_1, \ldots, a_r$ in $F_{2^m}$, and each a has $2^m$ values. Therefore, a total of $2^{m(r+1)}$ P matrices can be generated.

It can be learned from the foregoing formula that each P matrix is a linear combination of $P^t$, t=0, 1, ..., r. Therefore, DG(m,r) includes all lower-order sets. Herein, $P^t$ may be obtained by using the following formula:

$$Tr[(xy^{2^t} + x^{2^t}y)a] = (x_0 \ldots x_{m-1})P^t(a)(y_0 \ldots y_{m-1})^T$$

A specific method for calculating $P^t$ is similar to a method for calculating $P^0$ in the Kerdock set, and details are not described herein again.

In conclusion, the total of $2^{m(r+1)}$ P matrices included in DG(m,r) and $2^m$ vectors b can generate a total of $2^{m(r+2)}$ RM sequences. The total of $2^{m(r+2)}$ RM sequences generated by DG(m,r) are represented by a binary sequence number having a length of m(r+2). A mapping method is as follows:

1. The sequence number having the length of m(r+2) is divided into the lowest m bits and remaining m(r+1) bits.

2. A vector corresponding to the lowest m bits is the vector b.

3. The remaining m(r+1) bits are converted into a $2^m$-ary vector having a length of r+1, where each element is mapped to an element $a_t$, t=0, 1, ..., r in $F_{2^m}$, and then is mapped to $P^t$, t=0, 1, ..., r. Finally, a linearly combined P matrix is calculated based on the method for generating DG(m,r).

4. The RM sequence is calculated by using the P matrix and the vector b based on the RM sequence generation formula.

A problem of an insufficient quantity of pilots in configuring an uplink pilot can be resolved by using the non-orthogonal first pilot set is used as the target first pilot or the first pilot set, thereby greatly increasing a quantity of pilots and reducing a probability of pilot conflict. Compared with using a ZC sequence, further, a problem that user detection of a pilot has high complexity and low reliability can be resolved by using an RM sequence, thereby reducing detection complexity and improving detection reliability In the embodiments of this application, the first pilots in the first pilot set may correspond to the second pilot groups in a one to one manner. Specifically, the pilot transmission method in the embodiments of this application may further include: receiving, by the first terminal device, Radio Resource Control (RRC) signaling sent by the network device, where the RRC signaling includes information used to indicate a correspondence between a first pilot and a second pilot group. The determining, by a first terminal device, a target first pilot and a target second pilot group corresponding to the target first pilot includes: determining, by the first terminal device, the target first pilot; and determining, by the first terminal device based on the correspondence, the target second pilot group corresponding to the target first pilot.

Correspondingly, the network device sends RRC signaling to the first terminal device, where the RRC signaling includes information used to indicate a correspondence between a first pilot and a second pilot group. According to this method, the first terminal device can determine, based on the correspondence, the target second pilot group corresponding to the target first pilot.

For the network device, the receiving, by a network device, a target first pilot sent by a first terminal device in a time unit and a target second pilot group that corresponds to the target first pilot and that is repeatedly sent by the first terminal device on at least two symbols of the time unit includes: receiving, by the network device, at least one first pilot and at least one second pilot group in the time unit, where each of the at least one second pilot group includes at least two second pilots, the at least one first pilot includes the target first pilot, and the at least one second pilot group includes the target second pilot group. The performing, by the network device, terminal device detection based on the target first pilot includes: performing, by the network device, terminal device detection based on the target first pilot, to determine that a terminal device corresponding to the target first pilot is the first terminal device. The method further includes: determining, by the network device based on the correspondence between a first pilot and a second pilot group, the target second pilot group corresponding to the target first pilot in the at least one second pilot group.

Figure 3:
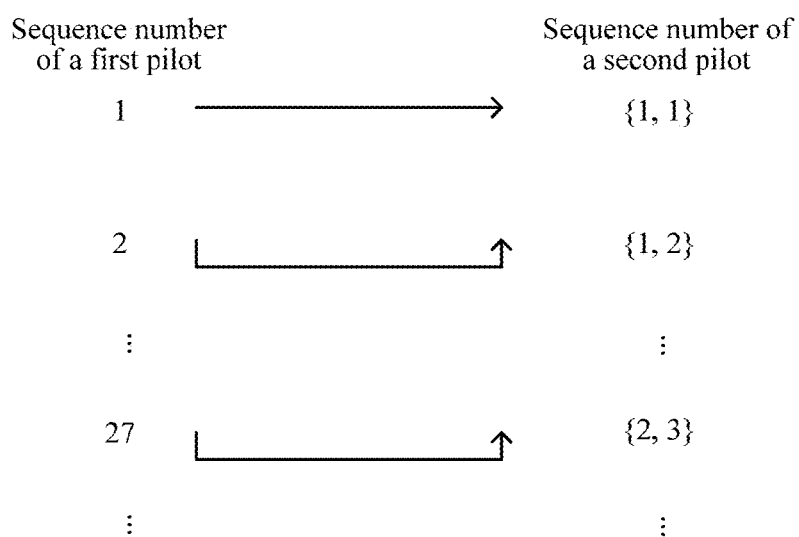
FIG. 3 is a schematic diagram of a correspondence between a first pilot and a second pilot group according to an embodiment of this application.

In a specific example, the first pilot in the first pilot space may be a non-orthogonal RM sequence, and the second pilot in the second pilot space may be an orthogonal RM sequence. As shown in FIG. 3, the second pilot space may be a subset of the first pilot space. Sequence numbers of the first pilots in the first pilot space are 1, 2, . . . , 27, . . . . Correspondingly, the second pilot groups are {1, 1}, {1, 2}, . . . , {2, 3}, . . . . A specific correspondence is shown in FIG. 3. It can be understood that the second pilot group {1, 1} includes two second pilots whose sequence numbers are 1. In this case, terminal devices sending the second pilot group need to send the two second pilots by using different time frequency resources. The second pilot space may not be a subset of the first pilot space, but is independent from the first pilot space. This is not limited in the embodiments of this application.

It should be understood that, alternatively, the correspondence between a first pilot and a second pilot group may be indicated by using other signaling than the RRC signaling sent by the network device to the terminal device, may be agreed by using a protocol, and so on. This is not limited in the embodiments of this application.

In a specific example of this application, the first terminal device selects the target first pilot from the first pilot space, and then determines, based on the RRC signaling, other signaling, or system configuration information in a protocol, the target second pilot group corresponding to the target first pilot. For example, there are a total of three terminal devices in a system. A target first pilot of a first terminal device is a pilot having a sequence number of 1, and a target second pilot group is {1, 1}. A first pilot of a second terminal device is a pilot having a sequence number of 2, and a second pilot group is {1, 2}. A first pilot of a third terminal device is a pilot having a sequence number of 27, and a second pilot group is {2, 3}. The $1^{st}$ second pilots in the second pilot groups of the three terminal devices are sent on a same time frequency resource, and the $2^{nd}$ second pilots in the second pilot groups of the three terminal devices are sent on another same time frequency resource.

In a specific implementation, the first pilot may be carried in a user detection reference signal (UDRS), and each second pilot in the second pilot group may be carried in a demodulation reference signal (DMRS), so as to be sent together with data. Certainly, the first pilot and each second pilot in the second pilot group may alternatively be carried in other signals for sending. This is not limited in the embodiments of this application.

The network device, for example, a base station, detects the first pilot, to determine a status of the terminal device, and to determine whether the terminal device is in an active state. For the first pilot for determining whether the terminal device is in an active state, a corresponding second pilot group is checked to find a non-conflicting second pilot in the second pilot group. For example, in the example mentioned above, a sequence number of a non-conflicting second pilot of the first terminal device is the second 1 in the target second pilot group {1, 1}, a sequence number of a non-conflicting second pilot of the second terminal device is 2, and sequence numbers of non-conflicting second pilots of the third terminal device are 2 and 3.

The network device uses the non-conflicting second pilot to perform channel estimation, time offset estimation, or frequency offset estimation. The network device uses a phase difference between signal correlation values of pilots on a same subcarrier and on different symbols to perform frequency offset estimation. Correspondingly, the performing, by the network device, frequency offset estimation based on a second pilot in the target second pilot group that is repeatedly sent on the at least two symbols of the time unit may include: performing, by the network device, frequency offset estimation based on a phase difference of at least one second pilot, which does not conflict with another terminal device in the target second pilot group, repeatedly sent on the at least two symbols of the time unit.

Specifically, for the first terminal device, the network device may perform user detection based on the target first pilot, to determine that the first terminal device corresponding to the target first pilot is in an active state. The network device determines the target second pilot group corresponding to the target first pilot. The network device performs frequency offset estimation based on a second pilot in the target second pilot group that is repeatedly sent on the at least two symbols of the time unit.

Moreover, the network device may further perform time offset estimation based on second pilots sent on a same symbol and on different subcarriers. The network device performs, based on a result of the channel estimation, the frequency offset estimation, and the time offset estimation, data demodulation on data sent by the first terminal device. In the embodiments of this application, accuracy of the frequency offset estimation performed by using a non-conflicting pilot is relatively high.

The following provides several specific examples for the pilot transmission method in the embodiments of this application, and provides examples of patterns (that is, positions) of the first pilot and the second pilot group in a channel.

Example 1

Figure 4:
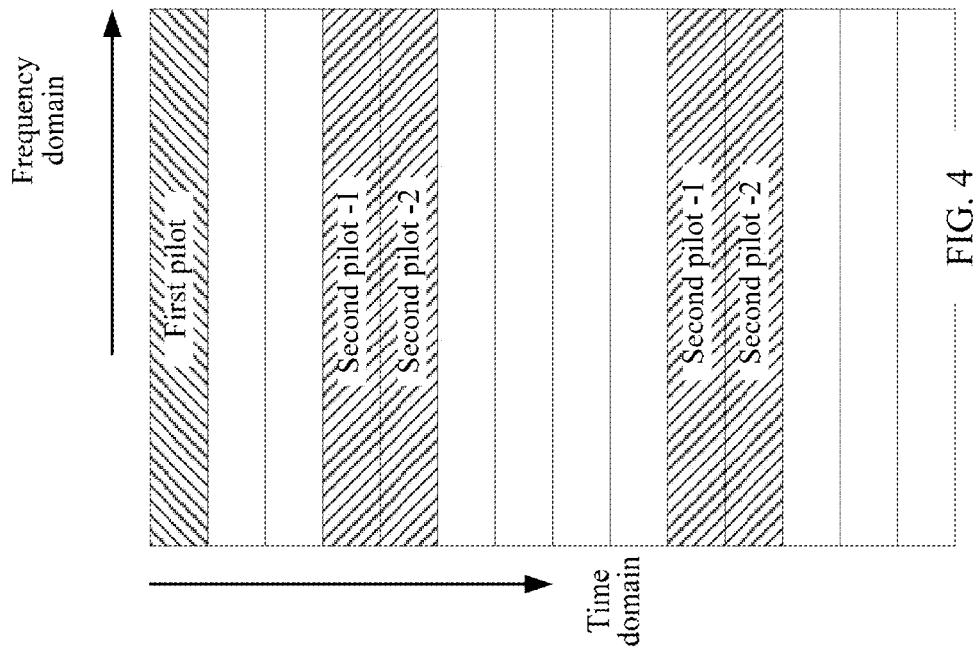
FIG. 4 is a schematic diagram of a pilot transmission method according to an embodiment of this application.

FIG. 4 is a schematic diagram of a pattern of a first pilot and a second pilot group in a channel according to an embodiment of this application. In this embodiment of this application, a target first pilot and a first pilot space use RM sequences, second pilots in a target second pilot group occupy a same frequency domain resource, and the second pilots are separately configured on different time domain resources.

For the pattern shown in FIG. 4, specific configurations of the pilots are as follows:

A first pilot occupies one symbol, and is a pilot in a first pilot space formed by non-orthogonal RM sequences. The first pilot space formed by the non-orthogonal RM sequence spaces may be very large. In addition, different from a ZC sequence, the RM sequence is detected through Walsh-Hadamard transformation. Therefore, complexity is low. Different from the ZC sequence, the RM sequence is not generated through shifting, and can better resist a time offset when being detected, so that time offset estimation is easier to perform and has higher accuracy.

In the pattern shown in FIG. 4, there are two second pilots: a second pilot -1 and a second pilot -2. The second pilot -1 and the second pilot -2 occupy a same frequency domain resource, and the second pilot -1 and the second pilot -2 are separately configured on different symbols. Each second pilot is sent twice on at least two symbols of a time unit for frequency offset estimation.

Example 2

Figure 5:
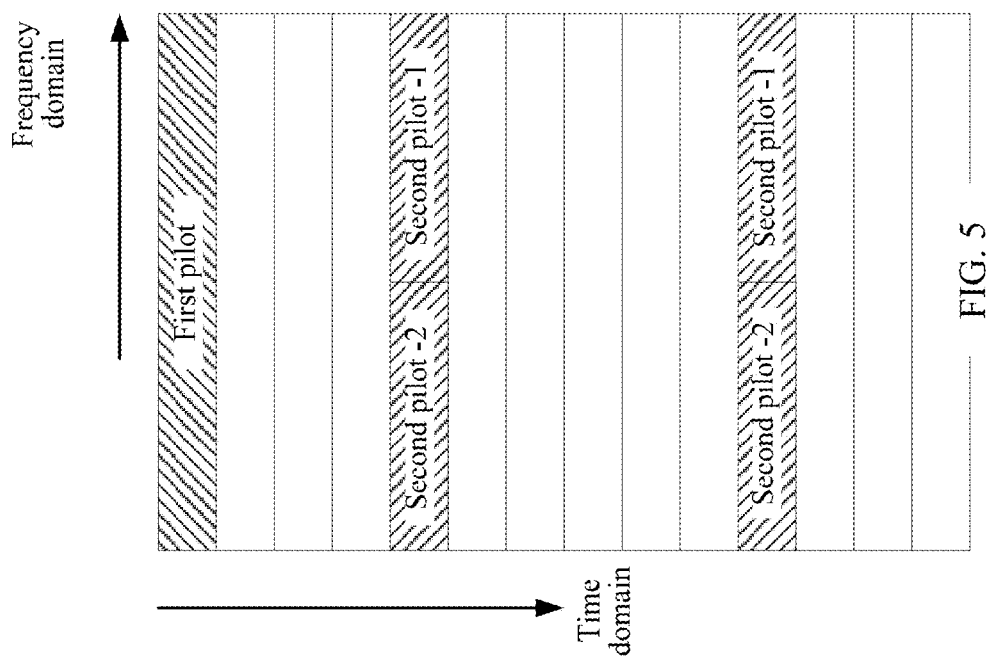
FIG. 5 is a schematic diagram of a pilot transmission method according to another embodiment of this application.

FIG. 5 is a schematic diagram of a pattern of a first pilot and a second pilot group in a channel according to another embodiment of this application. In this embodiment of this application, a target first pilot and a first pilot space use RM sequences, second pilots in a target second pilot group occupy a same time domain resource, and the second pilots are separately configured on different frequency domain resources.

For the pattern shown in FIG. 5, specific configurations of the pilots are as follows:

A first pilot occupies one symbol, and is a pilot in a first pilot space formed by non-orthogonal RM sequences.

In the pattern shown in FIG. 5, there are two second pilots: a second pilot -1 and a second pilot -2. Different second pilots are configured on a same symbol and on different frequency domain resources. Each second pilot is sent twice on at least two symbols of a time unit for frequency offset estimation.

Example 3

In another embodiment of this application, a target first pilot and a first pilot space use ZC sequences. A first pilot occupies one symbol, and is a pilot in a first pilot space formed by non-orthogonal ZC sequences. Sequences generated by using different radical exponents in a pilot space for the ZC sequences are not completely orthogonal. A time frequency resource occupied by a second pilot in a second pilot group may be shown in FIG. 4 or FIG. 5, and details are not described herein again.

It should be understood that, in the example provided in FIG. 4 or FIG. 5, the positions of the first pilot and each second pilot in the second pilot group are merely examples, and are not intended to limit the embodiments of this application. The second pilot -1 and the second pilot -2 may be a same sequence or different sequences. When the second pilot -1 and the second pilot -2 are a same sequence, the second pilot -1 and the second pilot -2 need to occupy different time frequency resources. When the second pilot -1 and the second pilot -2 are different sequences, the second pilot -1 and the second pilot -2 may occupy different time frequency resources or a same time frequency resource.

Optionally, in an embodiment, a first time frequency resource carrying the second pilot in the target second pilot group in the time unit further carries a second pilot in another second pilot group corresponding to the second terminal device. The second pilot in the another second pilot group is a pilot in the second pilot space, the second pilot in the target second pilot group on the first time frequency resource and the second pilot in the another second pilot group on the first time frequency resource are orthogonal in code domain. Alternatively, a first time frequency sub-resource of the second pilot in the target second pilot group carried on the first time frequency resource and a second time frequency sub-resource of the second pilot in the another second pilot group carried on the first time frequency resource are orthogonal.

In short, second pilots of different terminal devices that occupy a same time frequency resource are orthogonal in code domain, or time frequency resources occupied by second pilots of different terminal devices are orthogonal.

A specific example is shown as Example 4.

Example 4

Figure 6:
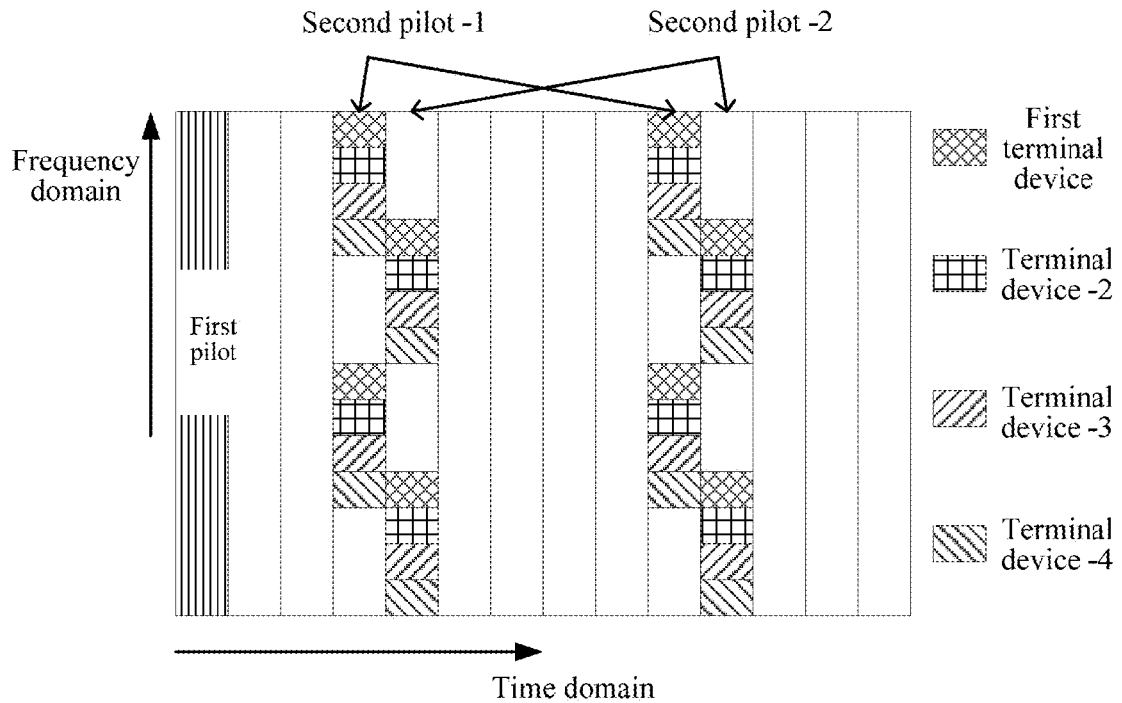
FIG. 6 is a schematic diagram of a pilot transmission method according to another embodiment of this application.

FIG. 6 is a schematic diagram of a pattern of a first pilot and a second pilot group in a channel according to an embodiment of this application. In this embodiment of this application, a target first pilot and a first pilot space use RM sequences or ZC sequences, second pilots in a target second pilot group occupy a same frequency domain resource, and the second pilots are separately configured on different time domain resources. A first time frequency resource of the second pilot in the target second pilot group further carries a second pilot in another second pilot group corresponding to another terminal device. The another terminal device, for example, may include a terminal device -2, a terminal device -3, and a terminal device -4 shown in FIG. 6. A first time frequency sub-resource of the second pilot in the target second pilot group carried on the first time frequency resource shown in FIG. 6 and a second time frequency sub-resource of the second pilot in the another second pilot group carried on the first time frequency resource are orthogonal. In addition to this, the second pilot in the target second pilot group on the first time frequency resource and the second pilot in the other second pilot group on the first time frequency resource may alternatively be orthogonal in code domain. This is not limited in this embodiment of this application.

The embodiments of this application further provide another pilot transmission method, including: determining, by a first terminal device, a target first pilot and a target second pilot group corresponding to the target first pilot, where the target second pilot group includes at least two second pilots, and the target first pilot is used by a network device to perform user detection; and sending, by the first terminal device, the target first pilot and the target second pilot group to the network device in a time unit, where the target first pilot and the target second pilot group are used by the network device to perform frequency offset estimation.

Correspondingly, a network device receives at least one first pilot and at least one second pilot group in a time unit, where each of the at least one second pilot group includes at least two second pilots, the at least one first pilot includes a target first pilot, and the at least one second pilot group includes a target second pilot group; the network device performs terminal device detection based on the target first pilot, to determine that a terminal device corresponding to the target first pilot is the first terminal device; the network device determines, based on a correspondence between a first pilot and a second pilot group, the target second pilot group corresponding to the target first pilot in the at least one second pilot group; and the network device performs frequency offset estimation based on a phase difference between the target first pilot and at least one second pilot in the target second pilot group.

Example 5

Figure 7:
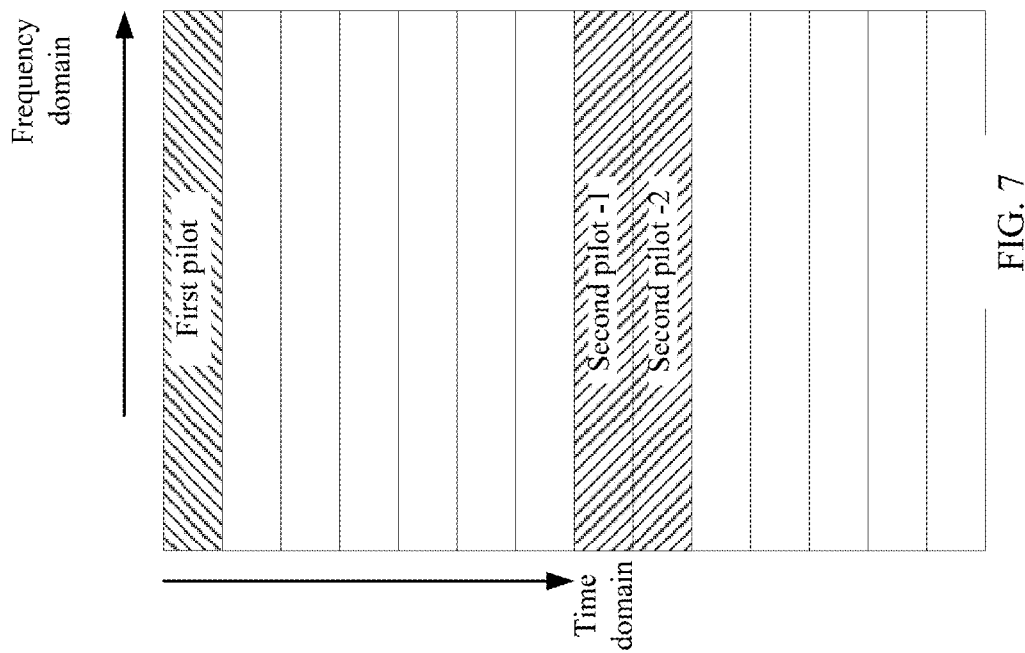
FIG. 7 is a schematic diagram of a pilot transmission method according to another embodiment of this application.

FIG. 7 is a schematic diagram of a pattern of a first pilot and a second pilot group in a channel according to an embodiment of this application. In this embodiment of this application, a target first pilot and a first pilot space use non-orthogonal RM sequences, second pilots in a target second pilot group occupy a same frequency domain resource, and the second pilots are separately configured on different time domain resources.

For the pattern shown in FIG. 7, specific configurations of the pilots are as follows:

A first pilot occupies one symbol, and is a pilot in a first pilot space formed by non-orthogonal RM sequences. In the pattern shown in FIG. 7, there are two second pilots: a second pilot -1 and a second pilot -2. The second pilot -1 and the second pilot -2 occupy a same frequency domain resource, and the second pilot -1 and the second pilot -2 are separately configured on different symbols. The first pilot is used by the network device to perform user detection, and to provide a reference phase for a second pilot. The network device performs frequency offset estimation by using a phase difference between a second pilot and a first pilot on a same subcarrier. It should be understood that, the first pilot and each second pilot may be repeatedly sent on a frequency domain resource. This is not limited in this embodiment of this application.

Figure 8:
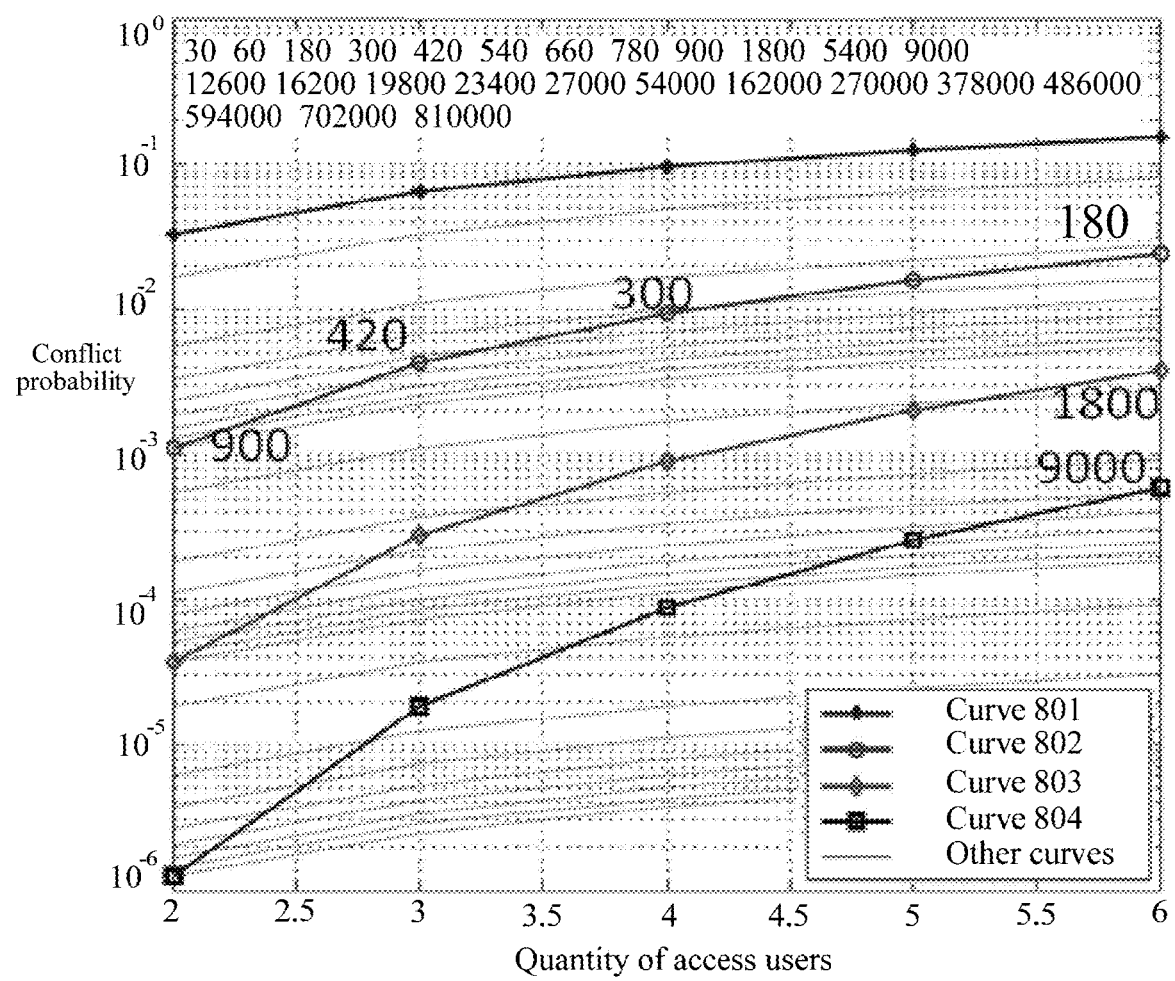
FIG. 8 is a schematic diagram of a probability that all second pilots in a second pilot group conflict according to an embodiment of this application.

In the embodiments of this application, provided that there is one non-conflicting second pilot in the at least two second pilots in the second pilot group, the non-conflicting second pilot may be used to perform channel estimation, frequency offset estimation, or time offset estimation. This improves reliability compared with the prior art. FIG. 8 is a schematic diagram of a probability that all second pilots conflict when at least two second pilots are sent. A horizontal coordinate is a quantity of access users, and a vertical coordinate is a conflict probability. A curve 801 (with a mark "+"), a curve 802 (with a mark "○"), a curve 803 (with a mark "◇"), and a curve 804 (with a mark "□") are respectively scenarios in which one second pilot, two second pilots, three second pilots, and four second pilots are sent. A second pilot space includes 30 orthogonal sequences. Other curves are scenarios in which only one second pilot is sent and quantities of sequences in second pilot spaces are different (the quantities of sequences are shown in FIG. 8 from top to bottom). Points intersected of the curve 801 to the curve 804 and lines with no mark reflect a quantity of equivalent sequences in the second pilot space in this case.

It can be learned from FIG. 8 that, when the quantity of access users is 2, 3, 4, or 6, and two second pilots are sent, approximately 900, 420, 300, or 180 second pilot groups may be provided. When the quantity of access users is 6, and three second pilots are sent, approximately 1800 second pilot groups may be provided. When the quantity of access users is 6, and four second pilots are sent, approximately 9000 second pilot groups may be provided. Therefore, a quantity of second pilot groups that can be provided can be greatly increased by sending at least two second pilots.

The terminal device and the network device in the embodiments of this application are described in detail below.

Figure 9:
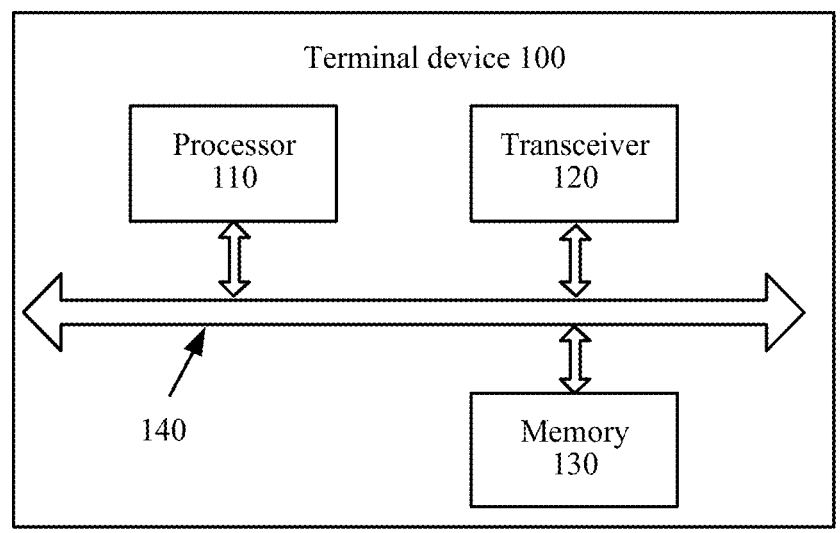
FIG. 9 is a schematic block diagram of a terminal device according to an embodiment of this application.

FIG. 9 is a schematic block diagram of a terminal device 100 according to an embodiment of this application. As shown in FIG. 9, the terminal device 100 includes:

a processor 110, configured to determine a target first pilot and a target second pilot group corresponding to the target first pilot, where the target first pilot is used by a network device to perform terminal device detection, and the target second pilot group includes at least two second pilots; and a transceiver 120, configured to send the target first pilot and the target second pilot group that are determined by the processor 110 to the network device in a time unit, where each second pilot in the target second pilot group is repeatedly sent on at least two symbols of the time unit, and the target second pilot group is used by the network device to perform frequency offset estimation.

When the terminal device provided in this application sends pilots, two pilots are distinguished. A first pilot is used for terminal device detection, a second pilot group corresponding to the first pilot is used for frequency offset estimation, and each second pilot in the second pilot group is repeated on at least two symbols of a time unit. This can support accurate frequency offset estimation, thereby improving system performance.

Optionally, the terminal device 100 may further include a memory 130. The memory 130 may be configured to store code executed by the processor 110. Components of the terminal device 100 are coupled together by using a bus system 140. In addition to a data bus, the bus system 140 includes a power bus, a control bus, and a status signal bus.

It should be noted that the foregoing method embodiment of this application may be applied to a processor, or implemented by a processor. The processor may be an integrated circuit chip and has a signal processing capability. In an implementation process, steps in the foregoing method embodiments can be implemented by using a hardware integrated logical circuit in the processor, or by using instructions in a form of software. The processor may be a general purpose processor, a digital signal processor (DSP), an application-specific integrated circuit (ASIC), a field programmable gate array (FPGA) or another programmable logical device, a discrete gate or transistor logic device, or a discrete hardware component. It may implement or perform the methods, the steps, and logical block diagrams that are disclosed in the embodiments of this application. The general purpose processor may be a microprocessor, or the processor may be any conventional processor or the like. Steps of the methods disclosed with reference to the embodiments of this application may be directly executed and accomplished by means of a hardware decoding processor, or may be executed and accomplished by using a combination of hardware and software modules in the decoding processor. A software module may be located in a mature storage medium in the art, such as a random access memory, a flash memory, a read-only memory, a programmable read-only memory, an electrically erasable programmable memory, a register, or the like. The storage medium is located in the memory, and a processor reads information in the memory and completes the steps in the foregoing methods in combination with hardware of the processor.

It may be understood that the memory in the embodiments of this application may be a volatile memory or a nonvolatile memory, or may include a volatile memory and a nonvolatile memory. The nonvolatile memory may be a read-only memory (ROM), a programmable read-only memory (PROM), an erasable programmable read-only memory (EPROM), an electrically erasable programmable read-only memory (EEPROM), or a flash memory. The volatile memory may be a random access memory (RAM), used as an external cache. Through example but not limitative description, many forms of RAMs may be used, for example, a static random access memory (SRAM), a dynamic random access memory (DRAM), a synchronous dynamic random access memory (SDRAM), a double data rate synchronous dynamic random access memory (DDR SDRAM), an enhanced synchronous dynamic random access memory (ESDRAM), a synchronous link dynamic random access memory (SLDRAM), and a direct rambus dynamic random access memory (DR RAM). It should be noted that the memory of the systems and methods described in this specification includes but is not limited to these and any memory of another proper type.

Optionally, in an embodiment, the target first pilot is a pilot in a first pilot set, the first pilot set includes a universal set of pilots used to perform terminal device detection and used by a terminal device served by the network device, each second pilot in the target second pilot group is a pilot in a second pilot set, the second pilot set includes a universal set of pilots used to perform frequency offset estimation and used by the terminal device served by the network device, the first pilot set includes two first pilots having a degree of coherence greater than zero, and a degree of coherence between any two second pilots in the second pilot set is zero.

Optionally, in an embodiment, the target first pilot is a Reed-Muller sequence or a Zadoff-Chu sequence, and each second pilot in the target second pilot group is a Reed-Muller sequence or a Zadoff-Chu sequence.

Optionally, in an embodiment, the target first pilot is generated by the terminal device based on a formula $\phi_{P,b}(x) = A \cdot i^{(2b+Px)^T x}$, where x=bin(k), a value of k is 0, 1, . . . , $2^m - 1$, bin(k) is a binary vector representation of k, A is an amplitude normalization parameter, P is a generator matrix, b is a generator vector, and a relationship between m and a length N of the target first pilot satisfies $N = 2^m$.

Optionally, in an embodiment, the transceiver 120 may be further configured to: before the processor determines the target first pilot and the target second pilot group corresponding to the target first pilot, receive RRC signaling sent by the network device, where the RRC signaling includes information used to indicate a correspondence between a first pilot and a second pilot group. The processor 110 is specifically configured to: determine the target first pilot; and determine, based on the correspondence, the target second pilot group corresponding to the target first pilot.

Optionally, in an embodiment, any two second pilots in the target second pilot group are orthogonal in code domain, or occupy orthogonal time frequency resources.

Optionally, in an embodiment, second pilots of different terminal devices that occupy a same time frequency resource are orthogonal in code domain, or time frequency resources occupied by second pilots of different terminal devices are orthogonal.

Figure 10:
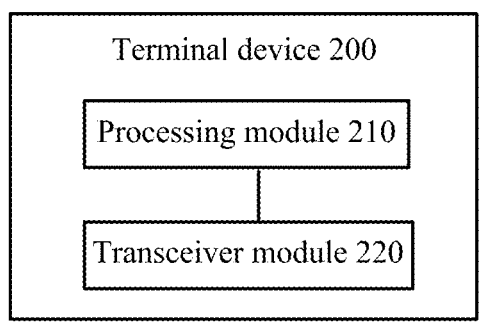
FIG. 10 is a schematic block diagram of a terminal device according to another embodiment of this application.

It should be noted that, in this embodiment of this application, the processor 110 may be implemented by a processing module, and the transceiver 120 may be implemented by a transceiver module. As shown in FIG. 10, a terminal device 200 may include a processing module 210 and a transceiver module 220.

The terminal device 100 shown in FIG. 9 or the terminal device 200 shown in FIG. 10 can implement various processes implemented in the embodiments of FIG. 3 to FIG. 8. To avoid repetition, details are not described herein again.

Figure 11:
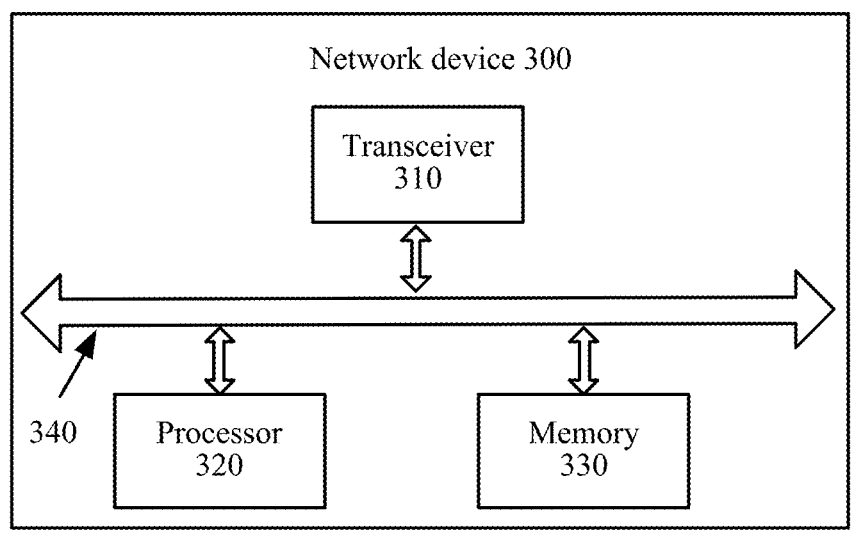
FIG. 11 is a schematic block diagram of a network device according to an embodiment of this application.

FIG. 11 is a schematic block diagram of a network device 300 according to an embodiment of this application. As shown in FIG. 11, the network device 300 may include:

a transceiver 310, configured to receive a target first pilot sent by a first terminal device in a time unit and a target second pilot group that corresponds to the target first pilot and that is repeatedly sent by the first terminal device on at least two symbols of the time unit, where the target second pilot group includes at least two second pilots; and a processor 320, configured to perform terminal device detection based on the target first pilot received by the transceiver 310.

The processor 320 is further configured to perform frequency offset estimation based on a second pilot that is in the target second pilot group received by the transceiver 310 and that is repeatedly sent on the at least two symbols of the time unit.

Pilots received by the network device provided in this application include two pilots. A first pilot is used for terminal device detection, a second pilot group corresponding to the first pilot is used for frequency offset estimation, and each second pilot in the second pilot group is repeated on at least two symbols of a time unit. This can support accurate frequency offset estimation, thereby improving system performance.

Optionally, the network device 300 may further include a memory 330. The memory 330 may be configured to store code executed by the processor 320. Components of the network device 300 are coupled together by using a bus system 340. In addition to a data bus, the bus system 340 includes a power bus, a control bus, and a status signal bus.

Optionally, in an embodiment, the target first pilot is a pilot in a first pilot set, the first pilot set includes a universal set of pilots used to perform terminal device detection and used by a terminal device served by the network device, each second pilot in the target second pilot group is a pilot in a second pilot set, the second pilot set includes a universal set of pilots used to perform frequency offset estimation and used by the terminal device served by the network device, the first pilot set includes two first pilots having a degree of coherence greater than zero, and a degree of coherence between any two second pilots in the second pilot set is zero.

Optionally, in an embodiment, the target first pilot is a Reed-Muller sequence or a Zadoff-Chu sequence, and each second pilot in the target second pilot group is a Reed-Muller sequence or a Zadoff-Chu sequence.

Optionally, in an embodiment, the target first pilot is generated by the first terminal device based on a formula $\phi_{P,b}(x)=A\cdot i^{(2b+Px)^T x}$, where x=bin(k), a value of k is 0, 1, ..., $2^m-1$, bin(k) is a binary vector representation of k, A is an amplitude normalization parameter, P is a generator matrix, b is a generator vector, and a relationship between m and a length N of the target first pilot satisfies $N=2^m$.

Optionally, in an embodiment, the transceiver 310 is specifically configured to: receive at least one first pilot and at least one second pilot group in the time unit, where each of the at least one second pilot group includes at least two second pilots, the at least one first pilot includes the target first pilot, and the at least one second pilot group includes the target second pilot group. The processor 320 is specifically configured to: perform terminal device detection based on the target first pilot, to determine that a terminal device corresponding to the target first pilot is the first terminal device. The processor 320 is further configured to: determine, by the network device based on a correspondence between a first pilot and a second pilot group, the target second pilot group corresponding to the target first pilot in the at least one second pilot group.

Optionally, in an embodiment, the transceiver 310 is further configured to: send RRC signaling to the first terminal device, where the RRC signaling includes information used to indicate the correspondence between a first pilot and a second pilot group.

Optionally, in an embodiment, any two second pilots in the target second pilot group are orthogonal in code domain, or occupy orthogonal time frequency resources.

Optionally, in an embodiment, second pilots of different terminal devices that occupy a same time frequency resource are orthogonal in code domain, or time frequency resources occupied by second pilots of different terminal devices are orthogonal.

Optionally, in an embodiment, the processor 320 is specifically configured to: perform frequency offset estimation based on a phase difference of at least one second pilot, which does not conflict with another terminal device in the target second pilot group, repeatedly sent on the at least two symbols of the time unit.

Figure 12:
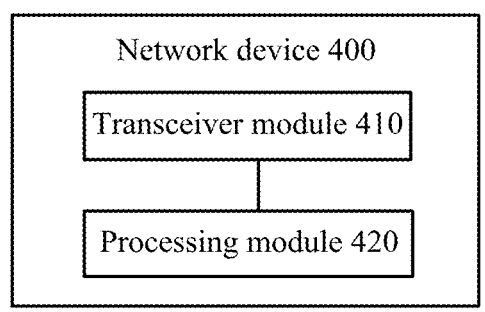
FIG. 12 is a schematic block diagram of a network device according to another embodiment of this application.

It should be noted that, in this embodiment of this application, the processor 320 may be implemented by a processing module, and the transceiver 310 may be implemented by a transceiver module. As shown in FIG. 12, a network device 400 may include a transceiver module 410 and a processing module 420.

The network device 300 shown in FIG. 11 or the network device 400 shown in FIG. 12 can implement various processes implemented in the embodiments of FIG. 3 to FIG. 8. To avoid repetition, details are not described herein again.

A person of ordinary skill in the art may be aware that, in combination with the examples described in the embodiments disclosed in this specification, method steps and units may be implemented by electronic hardware, computer software, or a combination thereof. To clearly describe the interchangeability between the hardware and the software, the foregoing has generally described steps and compositions of each embodiment according to functions. Whether the functions are performed by hardware or software depends on particular applications and design constraint conditions of the technical solutions. A person of ordinary skill in the art may use different methods to implement the described functions for each particular application, but it should not be considered that the implementation goes beyond the scope of this application.

Methods or steps described in the embodiments disclosed in this specification may be implemented by hardware, a software program executed by a processor, or a combination thereof. The software program may reside in a random access memory (RAM), a memory, a read-only memory (ROM), an electrically programmable ROM, an electrically erasable programmable ROM, a register, a hard disk, a removable disk, a CD-ROM, or any other form of storage medium known in the art.

This application is described in detail with reference to the accompany drawings and in combination with the example embodiments, but the present application is not limited thereto. Various equivalent modifications or replacements can be made to the embodiments of this application by a person of ordinary skill in the art without departing from the spirit and essence of this application, and the modifications or replacements shall fall within the scope of this application.

What is claimed is:

1. A pilot transmission method, comprising:
   determining, by a first terminal device, a target first pilot and a target second pilot group corresponding to the target first pilot, the target first pilot for enabling a network device to perform terminal device detection, and wherein the target second pilot group comprises at least two second pilots; and
   sending, by the first terminal device, the target first pilot and the target second pilot group to the network device in a time unit, wherein each second pilot in the target second pilot group is repeatedly sent on at least two symbols of the time unit, the target second pilot group for enabling the network device to perform frequency offset estimation.

2. The method according to claim 1, wherein:
   the target first pilot is a pilot in a first pilot set, and the first pilot set comprises a universal set of pilots to enable terminal device detection by the network device;
   each second pilot in the target second pilot group is a pilot in a second pilot set, and the second pilot set comprises a universal set of pilots to enable frequency offset estimation by the network device; and
   the first pilot set comprises two first pilots having a degree of coherence greater than zero, and a degree of coherence between any two second pilots in the second pilot set is zero.

3. The method according to claim 1, wherein:
   the target first pilot is a Reed-Muller sequence or a Zadoff-Chu sequence; and
   each second pilot in the target second pilot group is a Reed-Muller sequence or a Zadoff-Chu sequence.

4. The method according to claim 1, wherein:
   before determining, by the first terminal device, the target first pilot and the target second pilot group corresponding to the target first pilot, the method further comprises:
      receiving, by the first terminal device, Radio Resource Control (RRC) signaling sent by the network device, wherein the RRC signaling comprises information indicating a correspondence between a first pilot and a second pilot group; and
   determining, by the first terminal device, the target first pilot and the target second pilot group corresponding to the target first pilot comprises:
      determining, by the first terminal device, the target first pilot, and
      determining, by the first terminal device based on the correspondence, the target second pilot group corresponding to the target first pilot.

5. The method according to claim 1, wherein any two second pilots in the target second pilot group are orthogonal in code domain, or occupy orthogonal time frequency resources.

6. A pilot transmission method, comprising:
   receiving, by a network device, a target first pilot sent by a first terminal device in a time unit and a target second pilot group that corresponds to the target first pilot and that is repeatedly sent by the first terminal device on at least two symbols of the time unit, wherein the target second pilot group comprises at least two second pilots;
   performing, by the network device, terminal device detection based on the target first pilot; and
   performing, by the network device, frequency offset estimation based on a second pilot in the target second pilot group that is repeatedly sent on the at least two symbols of the time unit.

7. The method according to claim 6, wherein:
   the target first pilot is a pilot in a first pilot set, and the first pilot set comprises a universal set of pilots used for performing terminal device detection;
   each second pilot in the target second pilot group is a pilot in a second pilot set, and the second pilot set comprises a universal set of pilots used for performing frequency offset estimation; and
   the first pilot set comprises two first pilots having a degree of coherence greater than zero, and a degree of coherence between any two second pilots in the second pilot set is zero.

8. The method according to claim 6, wherein:
   the target first pilot is a Reed-Muller sequence or a Zadoff-Chu sequence; and
   each second pilot in the target second pilot group is a Reed-Muller sequence or a Zadoff-Chu sequence.

9. The method according to claim 6, further comprising:
   sending, by the network device, Radio Resource Control (RRC) signaling to the first terminal device indicating a correspondence between the target first pilot and the target second pilot group.

10. The method according to claim 6, wherein any two second pilots in the target second pilot group are orthogonal in code domain, or occupy orthogonal time frequency resources.

11. A terminal device, comprising:
    a processor, configured to determine a target first pilot and a target second pilot group corresponding to the target first pilot, the target first pilot for enabling a network device to perform terminal device detection, and wherein the target second pilot group comprises at least two second pilots; and
    a transceiver, configured to send the determined target first pilot and the determined target second pilot group to the network device in a time unit, wherein each second pilot in the target second pilot group is repeatedly sent on at least two symbols of the time unit, the target second pilot group for enabling the network device to perform frequency offset estimation.

12. The terminal device according to claim 11, wherein:
    the target first pilot is a pilot in a first pilot set, and the first pilot set comprises a universal set of pilots to enable terminal device detection by the network device;
    each second pilot in the target second pilot group is a pilot in a second pilot set, and the second pilot set comprises a universal set of pilots to enable frequency offset estimation by the network device; and
    the first pilot set comprises two first pilots having a degree of coherence greater than zero, and a degree of coherence between any two second pilots in the second pilot set is zero.

13. The terminal device according to claim 11, wherein:
    the target first pilot is a Reed-Muller sequence or a Zadoff-Chu sequence; and
    each second pilot in the target second pilot group is a Reed-Muller sequence or a Zadoff-Chu sequence.

14. The terminal device according to claim 11, wherein:
    the transceiver is further configured to:
       before the processor determines the target first pilot and the target second pilot group corresponding to the target first pilot, receive Radio Resource Control (RRC) signaling sent by the network device, wherein the RRC signaling comprises information indicating a correspondence between a first pilot and second a pilot group; and the processor is configured to:
    determine the target first pilot, and
    determine, based on the correspondence, the target second pilot group corresponding to the target first pilot.

15. The terminal device according to claim 11, wherein any two second pilots in the target second pilot group are orthogonal in code domain, or occupy orthogonal time frequency resources.

16. A network device, comprising:
    a transceiver, configured to receive a target first pilot sent by a first terminal device in a time unit and a target second pilot group that corresponds to the target first pilot and that is repeatedly sent by the first terminal device on at least two symbols of the time unit, wherein the target second pilot group comprises at least two second pilots; and
    a processor, configured to:
        perform terminal device detection based on the target first pilot received by the transceiver, and
        perform frequency offset estimation based on a second pilot that is in the target second pilot group received by the transceiver and that is repeatedly sent on the at least two symbols of the time unit.

17. The network device according to claim 16, wherein:
    the target first pilot is a pilot in a first pilot set, and the first pilot set comprises a universal set of pilots for performing terminal device detection;
    each second pilot in the target second pilot group is a pilot in a second pilot set, and the second pilot set comprises a universal set of pilots for performing frequency offset estimation; and
    the first pilot set comprises two first pilots having a degree of coherence greater than zero, and a degree of coherence between any two second pilots in the second pilot set is zero.

18. The network device according to claim 16, wherein:
    the target first pilot is a Reed-Muller sequence or a Zadoff-Chu sequence; and
    each second pilot in the target second pilot group is a Reed-Muller sequence or a Zadoff-Chu sequence.

19. The network device according to claim 16, wherein the transceiver is further configured to:
    send Radio Resource Control (RRC) signaling to the first terminal device indicating a correspondence between the target first pilot and the target second pilot group.

20. The network device according to claim 16, wherein any two second pilots in the target second pilot group are orthogonal in code domain, or occupy orthogonal time frequency resources.

* * * * *